(12) United States Patent
Rathei et al.

(10) Patent No.: US 6,717,431 B2
(45) Date of Patent: Apr. 6, 2004

(54) METHOD FOR SEMICONDUCTOR YIELD LOSS CALCULATION

(75) Inventors: Dieter Rathei, Graz (AU); Joerg Wohlfahrt, Yokohama (JP); Luis G. Andrade, Glen Allen, VA (US); Robert Petter, Wandiltz (DE); Thomas S. Taylor, Mechanicsville, VA (US); Babatunde Ashiru, Chester, VA (US); Mark E. Luzar, Chester, VA (US); Michael B. Sommer, Raubling (DE); Ulrich K. Zimmermann, Mechanicsville, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 0 days.

(21) Appl. No.: 10/137,142

(22) Filed: May 2, 2002

(65) Prior Publication Data

US 2003/0207474 A1 Nov. 6, 2003

(51) Int. Cl.[7] .................................................. G01R 31/26
(52) U.S. Cl. ...................................................... 324/765
(58) Field of Search ........................... 382/149; 324/765

(56) References Cited

U.S. PATENT DOCUMENTS 6,404,911 B2 * 6/2002 Ishihara ....................... 382/149
6,459,292 B1 * 10/2002 Oikawa ......................... 324/765

* cited by examiner

*Primary Examiner*—John F. Niebling
*Assistant Examiner*—Andre' C. Stevenson
(74) *Attorney, Agent, or Firm*—Slater & Matsil, LLP (57) ABSTRACT

A method of calculating yield loss of semiconductor wafers which are tested with a test sequence to derive a total fail region count for each of the wafers, the semiconductor wafers having multiple chips thereon. The method comprises calculating a fail region count for each of the tests in the test sequence, calculating the test sequence limited yield loss for each of the wafers, and apportioning the test sequence limited yield loss to selected ones of the test based upon the absolute or cumulative number of fails identified by the tests of the test sequence. In some embodiments, core parametric test data is correlated with the test sequence limited yield and analyzed to determine reparability.

20 Claims, 5 Drawing Sheets

METHOD FOR SEMICONDUCTOR YIELD LOSS CALCULATION

TECHNICAL FIELD OF THE INVENTION

This invention relates to semiconductor processes and more particularly to a method to calculate semiconductor yield loss.

BACKGROUND OF THE INVENTION

Yield reliability and loss is an important part of semiconductor manufacturing. Integrated circuits must be able to be produced in large quantities at low cost. The integrated circuits must also be capable of performing their intended function throughout their lives. To meet these requirements, tests are performed to find the causes of fails in order to eliminate them, as well as to identify circuits that will not perform up to design and customer expectation. The data from testing can be used to perform yield calculations.

Yield and yield loss calculations, in particular, allow semiconductor manufacturers to perform redundancy calculations. These calculations are utilized to decide how redundant or extra parts of a semiconductor device (e.g., redundant rows or columns in a semiconductor memory array) can be allocated to replace defective parts of the device. Because redundant parts are limited in number, it is important for the manufacturer to determine the most efficient utilization of these redundant parts. For example, if "fail two" (i.e. the failure at test number two) is the result of "fail one" (i.e. the failure at test number one) then utilizing the redundant parts to cure fail one will also cure fail two. Thus, understanding the relationship between fails and their sequence is important. Likewise, utilizing redundant parts to cure the most prevalent fails will provide best utilization of the limited number of redundant parts. There should be therefore, yield and yield loss calculations that will provide accurate results for assessment of redundant part usage. There should also be yield loss calculations which take into account the relationship between fails.

SUMMARY OF THE INVENTION

These and other problems are generally solved or circumvented, and technical advantages are generally achieved, by the present invention that is a method for calculating yield losses.

In one aspect, the present invention provides for a method of calculating yield loss of semiconductor wafers which are tested with a test sequence to derive a total fail region count for each of the wafers, the semiconductor wafers having multiple chips thereon. The method comprises calculating a fail region count for each of the tests in the test sequence, calculating a test sequence limited yield loss for each of the semiconductor wafers, and apportioning the test sequence limited yield loss to selected ones of the tests in the test sequence. The method further comprises analyzing the test sequence limited yield loss for determining reparability of one or more of the chips.

In another aspect the present invention provides for a computer program product for calculating the yield loss of semiconductor wafers. In this aspect, the product comprises a computer-readable medium; and computer executable instructions contained on the computer-readable medium. The computer executable instructions provide for performing the steps of calculating a fail region count for each of a plurality of tests in a test sequence and calculating a test sequence limited yield loss for each of the semiconductor wafers. The instructions further provide for apportioning the test sequence limited yield loss to selected ones of the tests in the test sequence and analyzing the test sequence limited yield loss for determining reparability one or more of the chips.

One advantage of a preferred embodiment of the present invention is that it provides a method of identifying fails for efficient allocation of yield loss.

Another advantage of a preferred embodiment of the present invention is that it provides a method of assigning a yield loss to a certain test by means of a statistical breakdown of the experienced yield loss for a large number of tests as opposed to assigning a yield loss by individual reparability calculations.

An advantage of a preferred embodiment of the present invention is that it takes into account the number of unique fails a test may have found.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the concepts and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying figures, in which.

DETAILED DESCRIPTION OF THE PREFERRED EMBODIMENTS

The making and use of the presently preferred embodiments is discussed in detail below. It should be appreciated, however, that the present invention provides many applicable inventive concepts that can be embodied in a wide variety of specific contexts. The specific embodiments discussed are merely illustrative and do not limit the scope of the invention.

A preferred embodiment of the present invention comprises calculating a fail region count for each test in a test sequence. At wafer test level, semiconductor chips are first tested for basic functionality. The percentage of chips that pass these functionality tests is called the pre-test yield or "screen yield". Thereafter, the chips undergo a sequence of functional and performance tests, each of which applies certain stress conditions to the chip. These functional and performance tests may apply voltage stresses, timing stresses, and complex test patterns to the chip, which provide insight into the product and fabrication sensitivities. This sequence of tests is called a test sequence.

When a test within the test sequence is being performed, a tester counts how many fail regions contain at least one failing bit. A fail region represents a logical partition of a chip. Therefore, for each test, a fail region count will be reported for each tested chip that fails a test. If the fail region count of a particular test is higher than usual, it is an indicator that the chips are affected by a problem related to the particular stress conditions of that test. However, the fail region count is not, in and of itself, an accurate representation of the fail count on a particular chip because it forfeits the information on how many fails are within the fail region. Whether there is one failing bit or thousands within one fail region, the fail region count will just count this one fail region and does not indicate how a certain fail region count affects the reparability of the chip. Thus, a test sequence limited yield (TSLY) loss need also be calculated for each of the wafers.

The test sequence limited yield represents the ratio of the percentage of chips that pass the test sequence divided by the screen yield. Effectively, this is the ratio of the chips that passed the full test sequence divided by the total number of chips that were tested with the test sequence. The test sequence limited yield loss, then, is the difference between the percentage of chips that pass the test sequence minus the screen yield.

The test sequence limited yield loss can be analyzed to determine reparability, where the reparability represents what parts of the chips can be repaired with redundant parts included on the chip. For example in a memory device, the redundant parts may be memory cells that can replace failed cells. The number of redundant cells are finite and thus, must be allocated in an efficient manner to provide the best overall reparability. The best use of redundant parts can provide fewer lost chips and wafers due to fails and reduce or eliminate the costs associated with such loss. The analysis of the test sequence data can include, but is not limited to, production of a pareto-chart of the yield impact.

Figure 1:
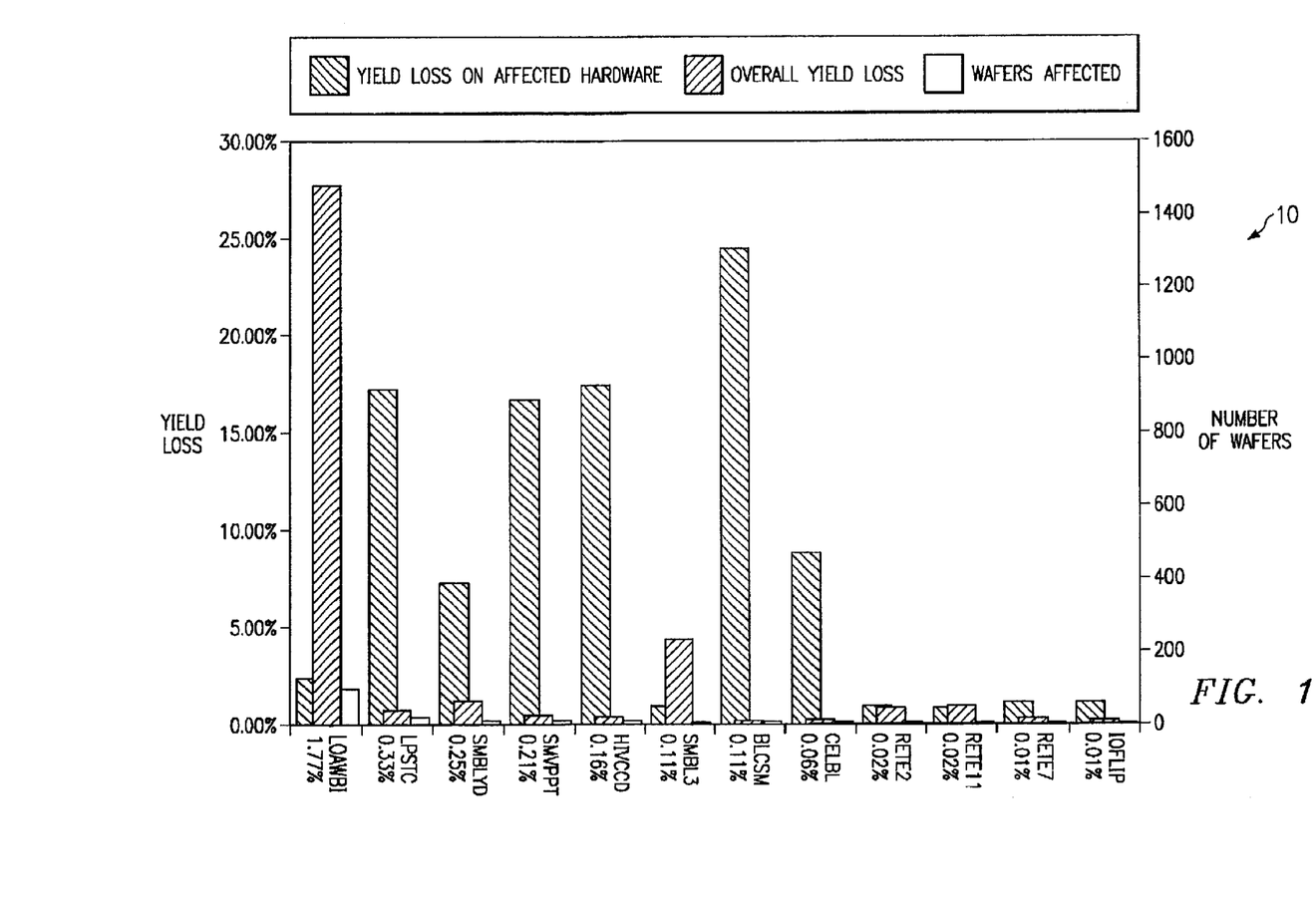
FIG. 1 is a sample yield loss chart of a preferred embodiment of the present invention.

A preferred embodiment of the present invention will provide for assignment of a yield loss to a certain test by means of a statistical breakdown of the yield loss experienced by a group of tests. In one embodiment, the analysis includes determining, for each of the wafers, the test with the highest fail region count and assigning that test as the primary detractor for the corresponding wafer and determining, for each of the tests, the number of wafers having that test as the primary detractor. The average test sequence limited yield loss of wafers that have that test as the primary detractor can be calculated. The yield impact for each of the tests can also be calculated. The yield impact is the product of the number of wafers having that test as the primary detractor and the corresponding average test sequence limited yield loss of wafers. FIG. 1 is a sample yield loss chart 10 of a preferred embodiment of the present invention. The chart illustrates the yield loss on affected hardware, overall yield loss, and the number of wafers affected.

The preferred embodiment method may be executed on any periodic basis, such as daily, weekly, monthly, or some other convenient time period. The method will extract test data that is collected out of production, filter the data, and provide a report that identifies the main test sequence limited yield problems or detractor associated with the corresponding yield loss. Ultimately the yield impact in units of "wafers lost" can be multiplied with the current revenue per wafer to obtain the profit loss associated with a particular test(s).

Another preferred embodiment method determines, for each of the wafers, the tests which have a fail region count which exceeds a given threshold and assigns a weighted percentage of the test sequence limited yield loss to each of those tests. In this manner, the several tests that exceed the given threshold are analyzed and assigned as detractors as opposed to assigning a single test as the primary detractor, as in the above described embodiment.

While the previous embodiments will allow for assignment and analysis of main detractor(s) to assist wafer manufacturers in determining a broad analysis of the best utilization of redundant cells, those embodiments do not take into account the relationships between various tests. Because the TSLY yield is an integrated yield based on the fail counts of many functional and performance tests, a method of analyzing yields based upon the organization of like tests into test corners can be used. The previous embodiment providing weighted assignments can be extended to test corners to focus the analysis on test corners as opposed to individual tests.

The test sequence can be divided into test corners of like tests and after a series of like tests in a test corner are performed, the yield is determined for that corresponding test corner. Tests can be grouped with respect to factors such as severity of the tests or retention time (i.e. the time taken to perform a test), the similarity between various tests, or some other logical grouping. By grouping the tests into test corners accordingly, the data can be better analyzed and the testing process streamlined. Only chips that pass the test corner in a test sequence continue to the next test corner and are included in the subsequent yield calculations that are performed. In order to include only significant peaks (i.e. significant contributors to yield loss), a threshold level is applied and only those tests having a peak above the threshold are considered. The yield calculation for a given test in a test corner is generally represented by $$TSLY \text{ loss in Test Corner } N = \left(\frac{TEST_N - PASS_N}{\sum SEQ}\right) * \frac{FAIL_N}{\sum PEAKS_N} \quad (1)$$

where the TSLY loss is the yield loss of a test in a specific test corner, $TEST_N$ is the number of chips tested in Test Corner N, $PASS_N$ is the number of chips passing the tests in Test Corner N, $\Sigma SEQ$ is the cumulative sum of chips passing the tests in the Test corner 0-N, $FAIL_N$ is the test fail count in test corner N, and $\Sigma PEAKS_N$ is the sum of the peaks above threshold in test corner N. The equation can be used to weight yield loss due to any test in a test corner.

This calculation can be extended to an algorithm that takes into consideration only the yield loss of the test in each test corner having the highest peak count above the threshold and weighting the yield losses. Thus, the algorithm will assign yield loss to tests in a specific test corner and weight the impact of each test based on the peak count. Algorithm (2) is represented by $$TSLY \text{ Loss} = \left[(YA - YBS1)/YA * (FRL \text{ Count}_{RD1} / \sum \text{Peaks}_{RD1})\right] + \quad (2)$$
$$\left[(YBS1 - YBS2))/YA * (FRL \text{ Count}_{RD2} / \sum \text{Peaks}_{RD2})\right] \ldots +$$
$$(YBSN - YBS(N+1))/YA * (FRL \text{ Count}_{RDN} / \sum \text{Peaks}_{RDN})$$

where N is the number of test corners, YA is the yield after the basic functionality tests have been performed (or effectively the number of chips that passed the functionality tests and will be tested in the test sequence), YBSN is the yield before the tests in the corner are performed and YBS(N+1)

is the yield before the tests in the next test corner are performed (or the yield after the series of tests in the current test corner have been performed), the FRL Count is the number of regions in that corner which fail the test having the highest number of peaks above the threshold, and the $\Sigma Peaks_{RDN}$ is the sum of the peaks above the threshold for all tests having peaks above the threshold in the test corner. The first portion of the equation, (YBSN−YBS(N+1))/YA, represents the overall test corner limited yield for that test corner. The second portion represents the percentage of loss for that test in its corresponding test corner.

Figure 2:
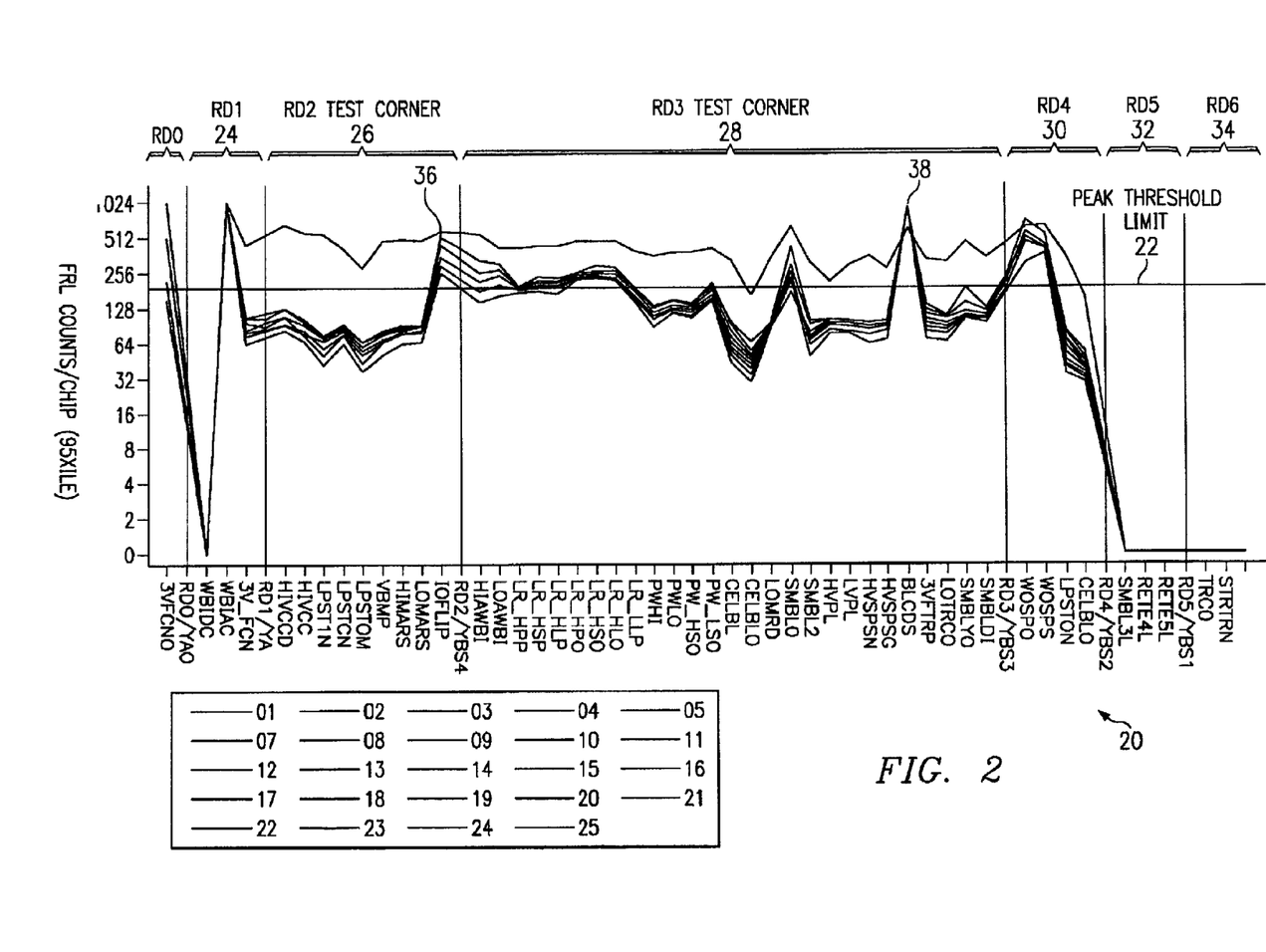
FIG. 2 is a sample chart of a preferred embodiment of the present invention.

FIG. 2 is a sample data chart 20 of the fail counts per chip for each test in the screen and functional and performance test sequences. The function and performance test sequence begins with the HIVCCD test. There are six test corners, RD1 through RD6, labeled 24 through 34, respectively. A peak threshold limit of about 224 fails is represented by the thick horizontal line, 22, which is drawn across the chart 20. Consider RD2 Test corner 24 for example. Test IOFLIP, indicated at 36, has the highest peak count in the RD2 test corner, therefore it would be considered the detractor for the RD2 test corner and included in the algorithm. Test BLCDS 38 has the highest peak count in RD3 test corner 28, so it would also be included in the algorithm. It should be recognized once again, that a single test does not have to be chosen as the detractor and the algorithm can be extended even further to represent all or any of the tests having a peak count above the threshold. For example, the first bracketed portion of the algorithm can be repeated for other tests in the RD2 corner and included in the calculation of the TSLY loss.

In yet another embodiment method of the present invention, the number of unique fails a test may have found are taken into account. Taking into account only the absolute number of fail counts per test does not factor in unique fails. Yield predictions utilizing absolute numbers give a prediction of where most fails take place but do not take into account redundancy uniquely used for a particular test, thus yield loss assessments will be skewed when looking at redundant part usage. This skewed data provides a broad view of the redundancy usage. This preferred embodiment considers redundant part usage while taking into account the types of situations where the cure of one fail will cure subsequent fails eliminating the need for usage of even more redundant parts.

This embodiment uses Algorithm 2 with a threshold level set to zero. However, the difference is the accumulated fail region count (FRC) instead of the absolute FRC is used to determine the yield impact of each test. Current testing on some equipment, for example, Advantest, supplies not only the absolute FRCs, but also the accumulated FRCs. Accumulated means that the FRC of a test only increases relative to its predecessor in the test sequence if it finds a fail in a perfect FRL (that means no previous test found any fails in that particular FRL). The difference in accumulated FRC between tests then indicates the number of new fails a particular test finds.

Using accumulated FRC data will show which test really does find new fails that require redundancy activation and thus contributes to yield loss. Setting a threshold for FRC will not be necessary since every increase in accumulated FRC means potential yield loss. Additionally, the hard fail counts that "pollute" the standard absolute fail counts will not be an issue when using the difference in accumulated fail counts. Placing the hard fail test (e.g. 3VFCN) at the beginning of the test sequence will automatically prevent those fails from influencing any of the following tests.

For example, the following Table 1 illustrates a test sequence chart. The sequence has four tests A–D. The FRC threshold is set at 75 to limit the number of tests considered for possible yield loss. Three tests exceed this limit, tests B, C, and D with 100 FRC, test A is below the limit with 50. Using the algorithm with absolute FRCs will result in test B, C and D each assigned 33% of the yield loss and test A assigned 0%. However, if tests B and C find the same fails, 50 of which are already found by test A prior to test B (A is below the 75 FRC threshold, therefore not considered in the calculation), while test D finds 100 new unique fails, test B would show 50 more accumulated FRCs than test A prior to it, while test C would find no new fails. Test D would have 100 additional FRC. Using the algorithm with a threshold value of 0 and the accumulated FRC data, the real yield impact would be closer to 25% for A, 25% for B and C together and 50% for test D as shown by the calculations of Table 2. Thus, test D identifies the areas where elimination of the cause of the fail would greatly increase overall yield.

TABLE 1

| Test | Absolute Fails | Weighted Percentage |
|------|----------------|---------------------|
| A | 50 | 0%* |
| B | 100 | 100/300 = 33% |
| C | 100 | 100/300 = 33% |
| D | 100 | 100/300 = 33% |

*Threshold is set at 75. Test A has less than 75 fails, so they are not counted.

TABLE 2

| Test | Absolute Fails | Accumulated Fails (Unique) | Weighted Percentage |
|------|----------------|----------------------------|---------------------|
| A | 50 | 50 | 50/200 = 25% |
| B | 100 | 50 | 50/200 = 25% |
| C | 100 | | |
| D | 100 | 100 | 100/200 = 50% |

It should be noted that the difference in accumulated FRC depends to some extent on the order of the tests within the test sequence. Arranging the tests in order of ascending "severity" will make the yield loss analysis more accurate. Arranging the tests in the order of descending "severity" will give guidelines for possible test time reduction by test elimination (i.e. tests that find no new fails may as well be eliminated from the test sequence). Groups of tests that find the same fails will automatically be treated correctly by assigning the yield loss to one of its members. Which member this is depends on the test sequence and is irrelevant, since the goal of yield improvement is to fix the root cause, making the fails on all tests of the group disappear (however, if that test is eliminated, no yield improvement will result since the next member test of the group will pick up the fails and the associated yield loss).

Figure 3:
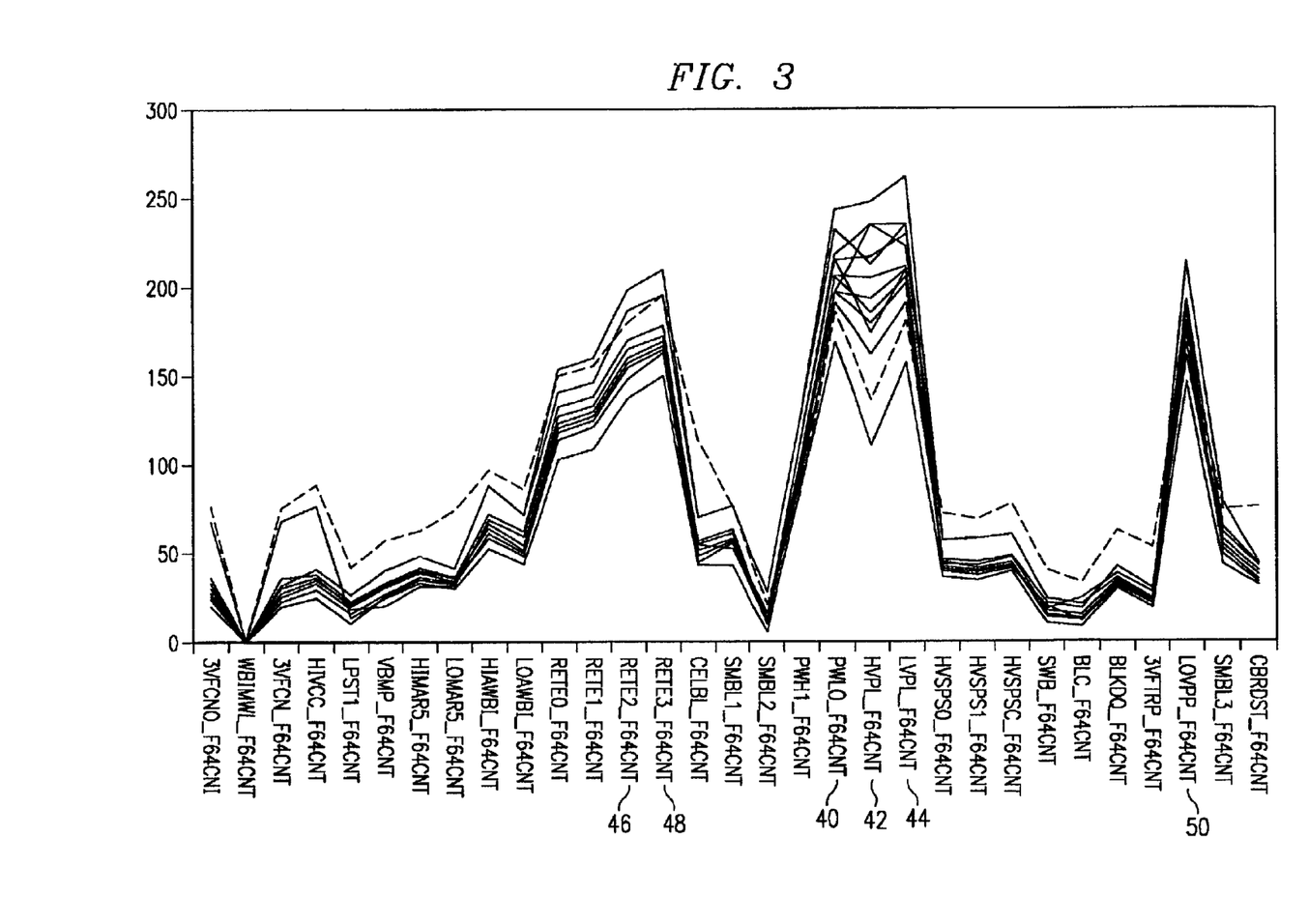
FIG. 3 illustrates individual fail region count data of a preferred embodiment of the present invention.
Figure 4:
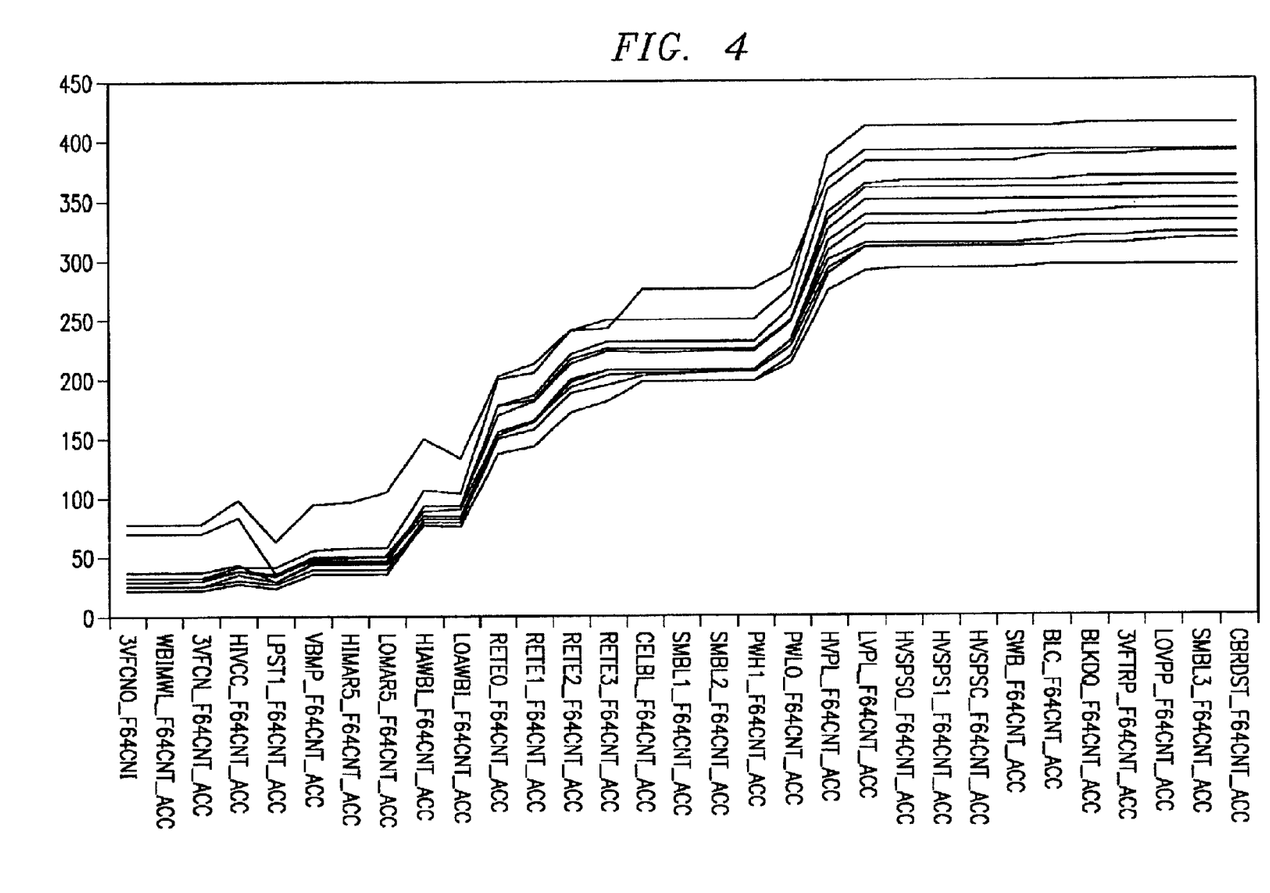
FIG. 4 represents accumulated fail region count data of another preferred embodiment of the present invention.
Figure 5:
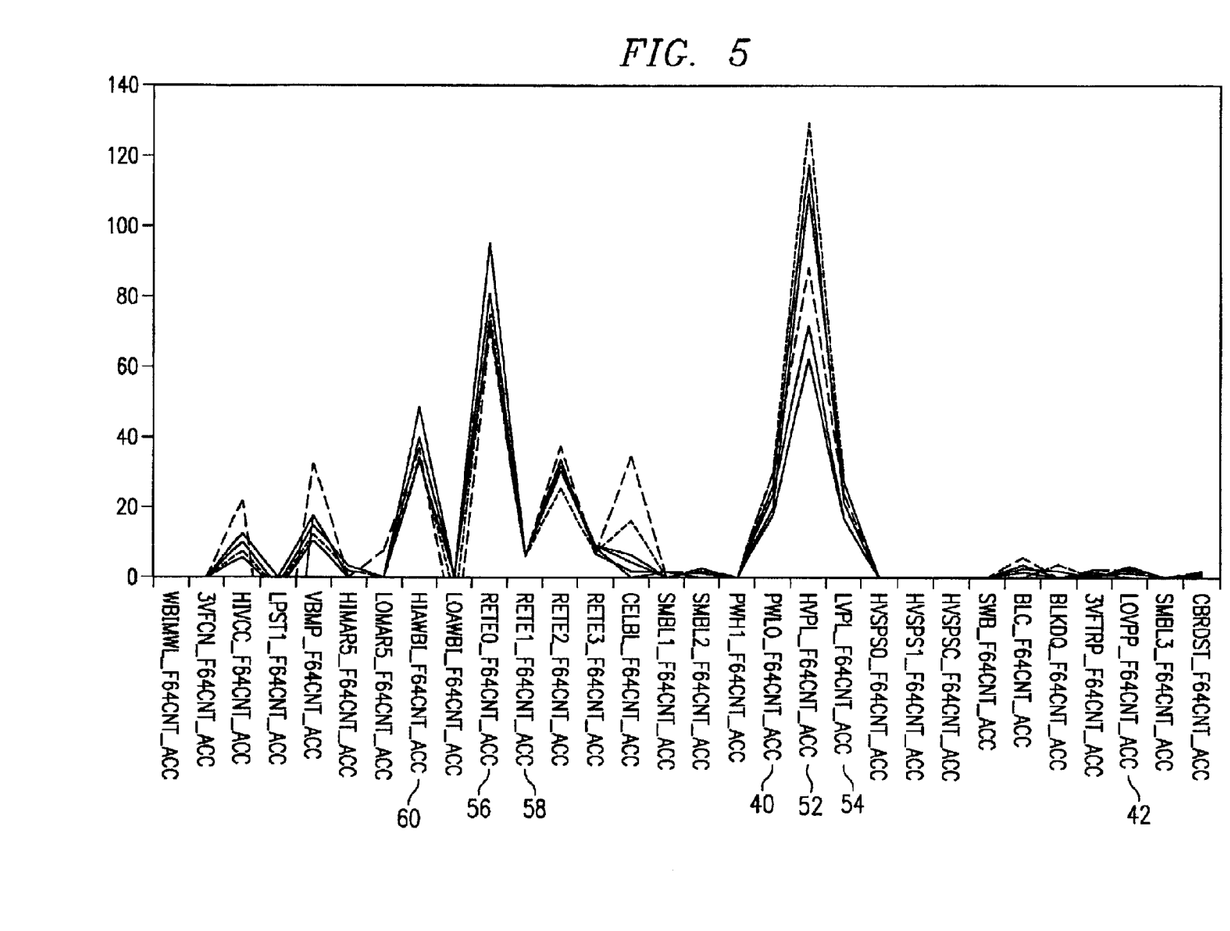
FIG. 5 represents the difference in accumulated fail region count data of another preferred embodiment of the present invention.

FIGS. 3, 4, and 5, illustrate the differences between the three different ways of presenting and interpreting the FRC on actual data. FIG. 3 illustrates the absolute FRC. Using the absolute FRC for yield impact determination, tests PWLO 40, HVPL 42, and LVPL 44 would be attributed about equal parts of the primary yield loss, while tests RETE2 46, RETE3 48, and LOVPP 50 would get about equal parts of the secondary yield loss. The distribution between primary and secondary yield loss would depend on the threshold set in the algorithm. FIG. 4 illustrates the accumulated FRC data (i.e. the number of "new" fails identified by each test) as discussed above. Referring to FIG. 5, that illustrates the difference in accumulated FRC, the main yield loss would be attributed to test HVPL 52, since this test apparently finds significant numbers of new fails. Of course, test LVPL 54 is likely to find the same fails (member of the same test group), but it would obviously be incorrect to assign separate portions of the yield loss to both tests. The second yield impactor would be test RETE0 56 (with RETE1 58 in the same group), and then test HIAWBI 40. In this scenario, LOVPP 42 is not attributed to any yield loss, since its fails are likely covered by the retention fails. Also, PWLO 44 does not show up as a major yield detractor, a reasonable result since this test constitutes only a slightly more severe test than RETE, not finding many new fails.

It should be noted that this method becomes less accurate if the accumulated fail count gets too close to the maximum value on some hardware (e.g. currently 1024 on Advantest) because the probability that a new fail falls into a non perfect FRL becomes high and the test may find new fails without increasing the accumulated FRC. However, for other hardware there is enough margin to the maximum FRC for accurate yield assessment.

A preferred embodiment computer program product for calculating the yield loss of semiconductor wafers comprises a computer-readable medium and computer executable instructions contained on the computer-readable medium. The computer executable instructions contain instructions for performing the steps of calculating a fail region count for each of the test in the test sequence, and calculating the test sequence limited yield loss for each of the wafers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of calculating yield loss of semiconductor wafers which are tested with a test sequence to derive a total fail region count for each of the wafers, the semiconductor wafers having multiple chips thereon, the method comprising:
   calculating a fail region count for each of the tests in the test sequence;
   calculating a test sequence limited yield loss for each of the semiconductor wafers;
   apportioning the test sequence limited yield loss to selected ones of the tests in the test sequence; and
   analyzing the test sequence limited yield loss for determining reparability of one or more of the chips.

2. The method of claim 1 wherein a fail region is a logical partition of a chip.

3. The method of claim 2 wherein the fail region count is the number of fail regions containing at least one failing bit.

4. The method of claim 1 wherein the step of apportioning the test sequence limited yield loss is based upon selecting tests in the test sequence exceeding a threshold number of fails.

5. The method of claim 1 wherein the method further comprises generating a pareto-chart of the yield impact.

6. The method of claim 1 wherein the method further comprises calculating the standard deviation and mean of test data for each of the wafers.

7. The method of claim 1 wherein the selected ones of the tests in the test sequence are those tests that identify the greatest number of unique fails.

8. The method of claim 1 wherein the test sequence limited yield is a ratio of a percentage of chips passing basic functionality tests to a percentage of chips that pass the test sequence.

9. The method of claim 8 wherein the test sequence limited yield loss is a difference between a percentage of chips passing the test sequence and a percentage of chips passing the basic functionality tests.

10. The method of claim 9 wherein analyzing the test sequence limited yield loss for efficient allocation of redundant cells further comprises:
    determining, for each of the wafers, a test with the highest fail region count and assigning that test as a primary detractor for the corresponding wafer;
    determining, for each of the tests, the number of wafers having that test as a primary detractor,
    calculating, for each of the tests, an average test sequence limited yield loss of wafers that have that test as a primary detractor; and
    calculating a yield impact for each of the tests, wherein the yield impact is the product of the number of wafers having that test as a primary detractor and the corresponding average test sequence limited yield loss of wafers.

11. The method of claim 9 wherein analyzing the test sequence limited yield loss for efficient allocation of redundant cells further comprises:
    determining, for each of the wafers, the tests which have a fail region count which exceeds a given threshold; and
    assigning a weighted percentage of the test sequence limited yield loss to each of the tests which have a fail region count which exceeds a given threshold.

12. The method of claim 11 wherein the weighted percentage assigned to a test is equal to the product of the test sequence limited yield and the fail region count of the test divided by the sum of the number of fail region counts for each of the tests which have fail region count which exceeds the given threshold.

13. The method of claim 11 wherein the test sequence is divided into groupings of functional and performance tests.

14. The method of claim 13 wherein the method further comprises determining, for each test corner, a test corner limited yield loss.

15. The method of claim 14 wherein the weighted percentage of the test sequence limited yield loss assigned to a test in a test corner is equal to the product of a redundancy yield loss and a weighted fail region count.

16. The method of claim 15 wherein the redundancy yield loss is equal to the ratio of the difference of the test corner yield loss of a prior test corner and the test corner yield loss of the current test corner to the test sequence limited yield.

17. The method of claim 15 wherein the weighted fail region count is equal to the fail region count of the test divided by the sum of the number of fail region counts for each of the tests in the test corner which have fail region count which exceeds the given threshold.

18. The method of claim 17 wherein the weighted fail region count is equal to the number of unique fail region counts of the test divided by the sum of the fail region counts for each of the tests in the test corner.

19. The method of claim 18 wherein a unique fail region count is the difference between the number of fail region counts for the test and the number of fail region counts which have been found in a prior test.

20. The method of claim 18 wherein the tests of the test sequence are performed in order of ascending severity.

* * * * *